(12) United States Patent
Srinivasan et al.

(10) Patent No.: US 9,461,014 B2
(45) Date of Patent: Oct. 4, 2016

(54) METHODS OF FORMING ULTRA THIN PACKAGE STRUCTURES INCLUDING LOW TEMPERATURE SOLDER AND STRUCTURES FORMED THERBY

(71) Applicant: Intel Corporation, Santa Clara, CA (US)

(72) Inventors: Sriram Srinivasan, Chandler, AZ (US); Ram S. Viswanath, Phoenix, AZ (US); Paul R. Start, Chandler, AZ (US); Rajen S. Sidhu, Chandler, AZ (US); Rajasekaran Swaminathan, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 14/686,177

(22) Filed: Apr. 14, 2015

(65) Prior Publication Data

US 2015/0221609 A1 Aug. 6, 2015

Related U.S. Application Data

(62) Division of application No. 13/721,329, filed on Dec. 20, 2012, now Pat. No. 9,064,971.

(51) Int. Cl.
*H01L 21/00* (2006.01)
*H01L 23/00* (2006.01)
*H01L 23/498* (2006.01)
*H01L 23/367* (2006.01)
*H01L 23/42* (2006.01)

(52) U.S. Cl.
CPC ........... *H01L 24/81* (2013.01); *H01L 23/3675* (2013.01); *H01L 23/42* (2013.01); *H01L 23/49816* (2013.01); *H01L 23/49838* (2013.01); *H01L 23/562* (2013.01); *H01L 24/13* (2013.01); *H01L 24/16* (2013.01); *H01L 2224/131* (2013.01); *H01L 2224/13111* (2013.01); *H01L 2224/16225* (2013.01); *H01L 2224/16227* (2013.01); *H01L 2224/73253* (2013.01); *H01L 2224/8121* (2013.01); *H01L 2224/81203* (2013.01); *H01L 2224/81801* (2013.01); *H01L 2924/014* (2013.01); *H01L 2924/01015* (2013.01); *H01L 2924/01028* (2013.01); *H01L 2924/01029* (2013.01); *H01L 2924/01047* (2013.01); *H01L 2924/01049* (2013.01); *H01L 2924/01051* (2013.01); *H01L 2924/01083* (2013.01); *H01L 2924/01322* (2013.01); *H01L 2924/1436* (2013.01); (Continued)

(58) Field of Classification Search
CPC ............ H01L 2224/81815; H01L 2924/3511; H01L 2224/1308; H01L 2924/01049; H01L 23/49816; H01L 2224/8121
USPC ......................................... 438/106, 125, 118
See application file for complete search history.

(56) References Cited

U.S. PATENT DOCUMENTS 5,641,946 A * 6/1997 Shim ................... H01L 21/4853
174/260
5,814,890 A 9/1998 Iwasaki
(Continued)

*Primary Examiner* — S. V. Clark
(74) *Attorney, Agent, or Firm* — Winkle, PLLC

(57) ABSTRACT

Methods of forming a microelectronic packaging structure and associated structures formed thereby are described. Those methods and structures may include attaching a device to a patch substrate, wherein the assembled device and patch substrate comprise a warpage, attaching the assembled device and patch substrate to an interposer to form a package structure, and then reflowing the package structure at a temperature below about 200 degrees Celsius to form a substantially flat package structure.

26 Claims, 7 Drawing Sheets

(52) U.S. Cl.
CPC ........... *H01L 2924/15311* (2013.01); *H01L 2924/15321* (2013.01); *H01L 2924/15331* (2013.01); *H01L 2924/2064* (2013.01); *H01L 2924/20105* (2013.01); *H01L 2924/20643* (2013.01); *H01L 2924/3511* (2013.01); *H01L 2924/3512* (2013.01)

(56) References Cited

U.S. PATENT DOCUMENTS

| | | | |
|---|---|---|---|
| 5,854,507 A | 12/1998 | Miremadi et al. | |
| 6,191,483 B1 | 2/2001 | Loo | |
| 7,038,316 B2 | 5/2006 | Hu et al. | |
| 7,560,373 B1 | 7/2009 | Hua | |
| 8,053,334 B2 * | 11/2011 | Yokokawa | H01L 21/02238 438/455 |
| 2003/0047814 A1 | 3/2003 | Kwon | |
| 2007/0152331 A1 | 7/2007 | Kang et al. | |
| 2011/0031610 A1 * | 2/2011 | Yamazaki | H01L 23/4985 257/693 |
| 2011/0042772 A1 | 2/2011 | Hampp et al. | |
| 2011/0186991 A1 | 8/2011 | Lee et al. | |
| 2013/0228916 A1 | 9/2013 | Mawatari | |
| 2015/0077662 A1 * | 3/2015 | Pugh | G02C 7/04 349/13 |
| 2016/0126215 A1 * | 5/2016 | Imbert | H01L 21/187 438/457 |

\* cited by examiner

METHODS OF FORMING ULTRA THIN PACKAGE STRUCTURES INCLUDING LOW TEMPERATURE SOLDER AND STRUCTURES FORMED THERBY

RELATED APPLICATIONS

The present application is a divisional of U.S. patent application Ser. No. 13/721,329, filed on Dec. 20, 2012, entitled "METHODS OF FORMING ULTRA THIN PACKAGE STRUCTURES INCLUDING LOW TEMPERATURE SOLDER AND STRUCTURES FORMED THERBY", which is hereby incorporated herein by reference in its entirety and for all purposes.

BACKGROUND OF THE INVENTION

As microelectronic packaging technology advances for higher processor performance, there is a need for technologies that enable very thin package structures. In order to fabricate ultra thin ball grid array (BGA) packages, for example, a die/device and a substrate core must undergo processing to reduce thickness. However, such thinning processes frequently result in very high package warpage, particularly during surface mount reflow processing.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
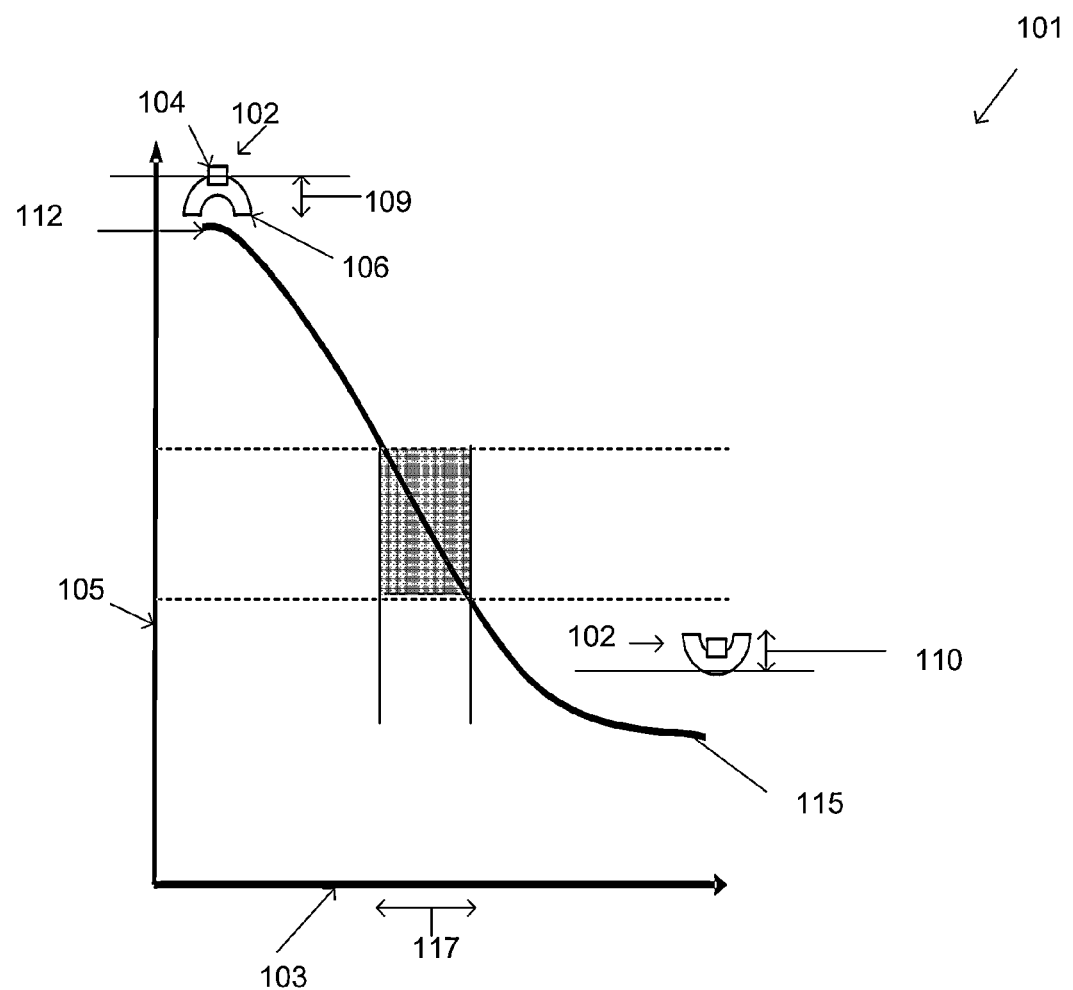
FIG. 1a represents a graph according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled.

In the drawings, like numerals may refer to the same or similar functionality throughout the several views.

Methods of forming and utilizing microelectronic package structures, such as patch on interposer package structures comprising low temperature solder connections. Those methods and structures may include attaching a device to a patch substrate, wherein the assembled device and patch substrate comprise a warpage, attaching the assembled device and patch substrate to an interposer to form a package structure, and then reflowing the package structure at a temperature below about 200 degrees Celsius to form a substantially flat package structure. The package structures of the various embodiments disclosed herein enable the fabrication of large, ultrathin BGA package structures.

FIG. 1a illustrates a graph of dynamic response 101 (dynamic shape change 101) of a micropackage structure 102, such as a BGA microelectronic package 102, relative to temperature 103. Package structures (such as the BGA package 102) undergoing lead free solder attach process may be surface mounted at 260 Celsius, which is the tin-silver-copper (SAC) alloy melting temperature.

The package structure 102 may comprise a die 104 coupled with a substrate 106, such as a patch substrate 106. The package structure 102 may undergo a warpage/shape change 105 relative to temperature 103. In an embodiment, the package structure 102 may comprise a warpage 109 that may be a convex warpage shape at room temperature 112. The amount of warpage 109 that may exist at room temperature may depend upon the materials of the package structure 102 and may be optimized according to the particular application. In some cases, the warpage may comprise between about 400 and 700 microns.

As the temperature 103 is increased, the package structure 102 may undergo a shape change, and may become relatively flat in shape at a flat shape temperature range 117. The flat shape temperature range 117 may comprise a temperature range that is below a typical/prior art surface mount reflow temperature 115. In an embodiment, the package structure 102 may comprise a convex shape and may comprise a warpage1 10 at a reflow temperature 115 that may comprise about 260 degrees Celsius for SAC solder, which may comprise mid level interconnect solder. By using a low temperature solder material that melts in a range between about 140 degrees to about 200 degrees Celsius, the package structure warpage can be tailored/designed to produce a substantially flat package structure after surface mount reflow processing.

Figure 1B:
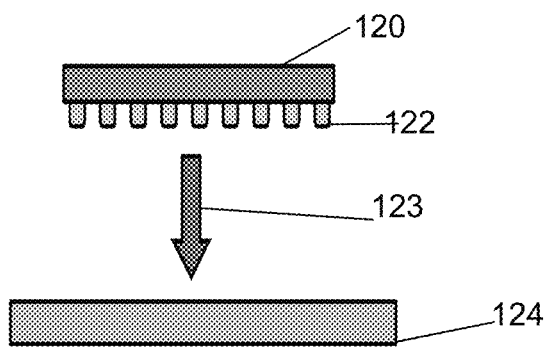
FIGS. 1b-1e represent structures according to various embodiments.

In an embodiment, a device/die 120 may comprise solder balls 122 that couple/attach the device 120 to a patch substrate 124 (FIG. 1b). In an embodiment, the patch substrate 124 may comprise a thin core (about 400 microns or less in thickness, for example), and may support routing and power delivery functions of a microelectronic device/system. In an embodiment, the die 120 may be attached to the patch substrate 124 by using at least one of a thermal compression bonding process and a chip attach process, such as a captive chip attach process.

Figure 1C:
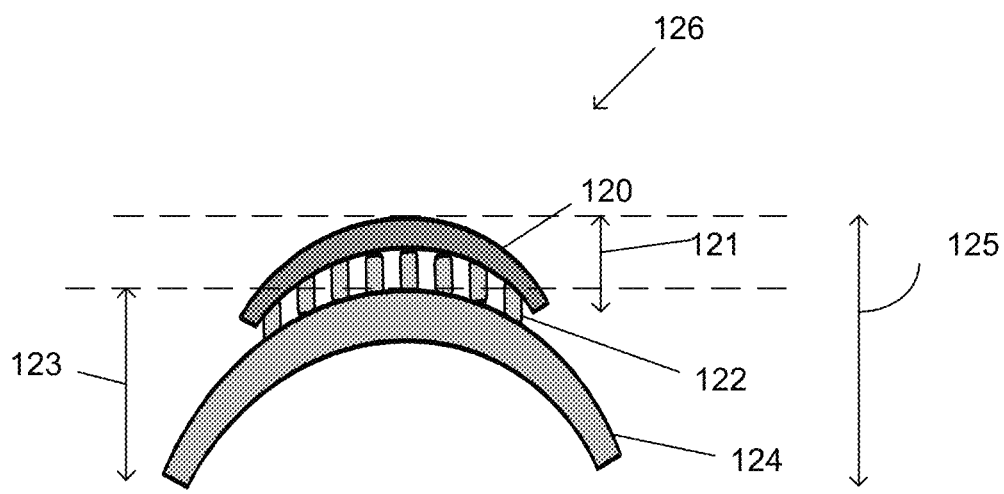

The assembled/coupled device and patch stack 126 may comprise a total warpage 125 (FIG. 1c). The total warpage 125 may comprise a combination of a die warpage 121 and a patch warpage 123. The amount of total warpage 125 may be optimized according to the particular application. The warpage 125 may comprise up to about 300 microns or more in some cases. In an embodiment, the assembled device and patch substrate 126 may undergo a shape inflection during surface mount reflow temperature between about 150 degrees to about 200 degrees Celsius.

Figure 1D:
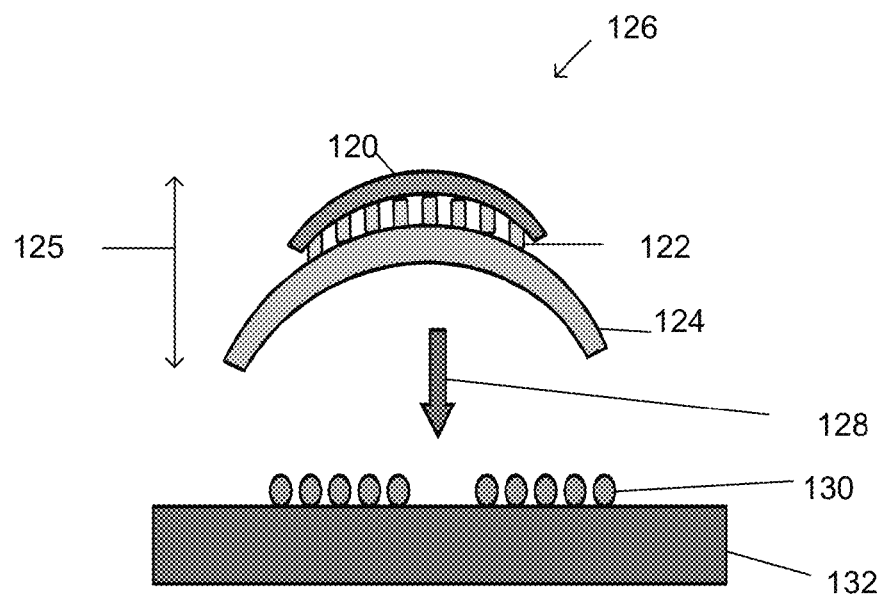
Figure 1E:
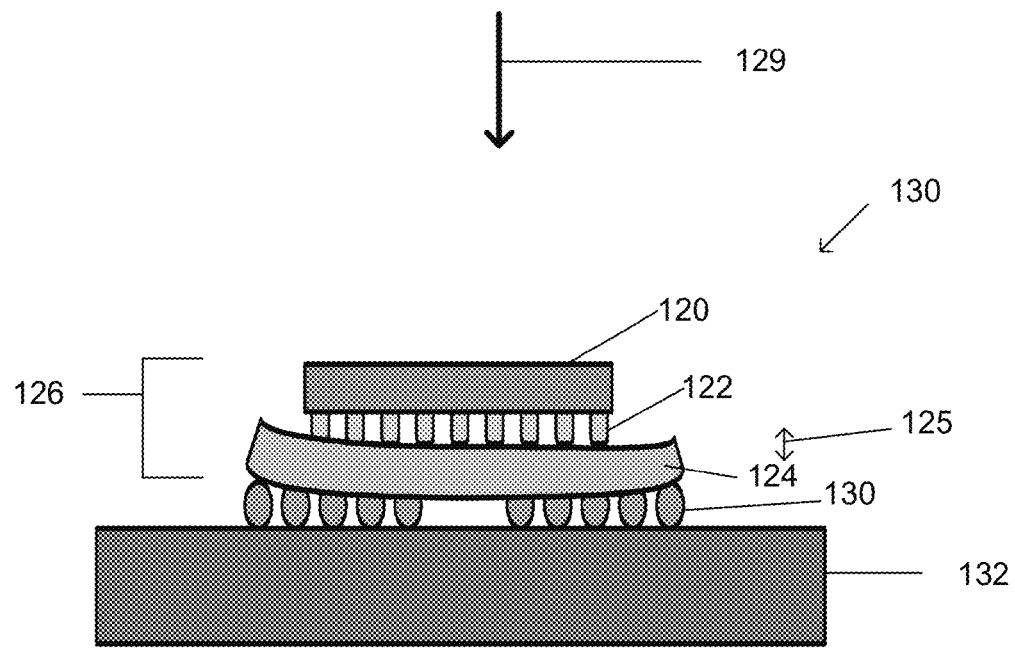

The assembled die and patch substrate 126 may be coupled with an interposer 132 (FIG. 1*d*). The assembled die and patch substrate 126 may be coupled to the interposer 132 using a surface mount process 128, including a surface mount reflow process, for example. In an embodiment, the surface mount reflow process may comprise a reflow temperature 129 (FIG. 1*e*). In an embodiment, the surface mount reflow temperature 129 may comprise below about 200 degrees Celsius. In another embodiment, the surface mount reflow temperature may comprise between about 150 and 170 degrees Celsius. In an embodiment, the interposer 132 may comprise solder balls 130, which may comprise a tin rich bismuth solder alloy. In an embodiment, the assembled die and patch substrate 126 may undergo a shape inflection such that the assembled die and patch substrate become substantially flat after surface mount reflow processing.

The solder balls 130 may comprise a low temperature solder, which may comprise a melting temperature of below about 200 degrees Celsius. In an embodiment, the low temperature solder 130 alloy may comprise a melting temperature below about 185 degrees Celsius. In an embodiment, the low temperature alloy may comprise a melting temperature of between about 130 degrees Celsius and about 180 degrees Celsius. In an embodiment, the low temperature solder alloy may comprise a non-eutectic tin rich bismuth alloy in some case, and may comprise a eutectic tin rich bismuth alloy in other embodiments.

In an embodiment, the solder balls 130 comprising the low temperature tin-bismuth alloy may comprise greater than about 50 percent tin by percentage weight. In another embodiment, the low temperature tin-bismuth alloy solder balls 130 may comprise at least one of copper, antimony, indium, nickel and silver, wherein these elements comprise between about 0.5 to about 3.0 percent weight percentage. In an embodiment, the low temperature tin-bismuth solder 130 alloy may comprise a tin percentage of between about 42 to about 60 percent tin by percentage weight.

In an embodiment, the low temperature tin-bismuth solder 130 alloy may comprise a liquidus temperature between about 130 degrees and about 180 degrees Celsius. In an embodiment, the low temperature tin-bismuth solder 130 alloy may comprise a lead free tin-bismuth solder alloy. By using the low temperature tin-bismuth solder 130 alloy, the device and patch stack 126 may be designed/optimized to undergo a shape change that results in a substantially flat profile after undergoing the reflow process at a temperature below about 200 degrees Celsius.

In an embodiment, the device and patch stack 126 may comprise a warpage 125 of less than about 50 microns after reflow, thus enabling the fabrication of a substantially flat package structure 130, which may comprise a patch on interposer package structure 130, after reflow. The use of an off-euctectic or eutectic tin-bismuth alloy as the low temperature solder enables less dynamic warpage during reflow processing. Additionally, the addition of copper, indium and antimony in the low temperature solder balls 130 enhances the intermetallic joint quality, and bulk solder joint reliability of the solder ball 130 interface with the interposer. A brittle phosphorus intermetallic layer may be avoided with the addition of copper to the solder alloy.

Figure 5A:
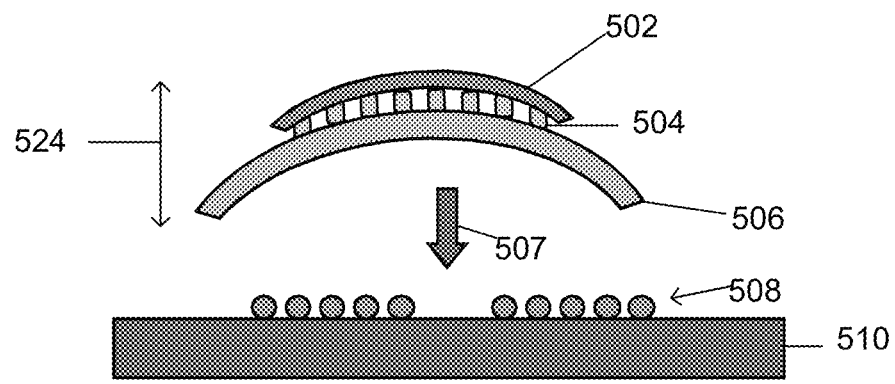
FIGS. 5a-5b represent structures according to the Prior Art.

FIG. 5*a* depicts a prior art structure in which a die 502 is coupled to a patch substrate 506 by solder balls 504 using chip attach or thermal compression bonding processes, wherein the die and patch stack comprise a high level of warpage 524. The warpage 524 may comprise between about 400 and 700 microns in some cases. The die and patch substrate stack is then coupled to an interposer 510 using prior art surface mount techniques 507, wherein solder balls 508 coupling the patch substrate 506 to the interposer 510 comprise solder with a melting temperature of above about 250 degrees Celsius, such as silver, gold, copper (SAC) lead free solder, for example.

Figure 5B:
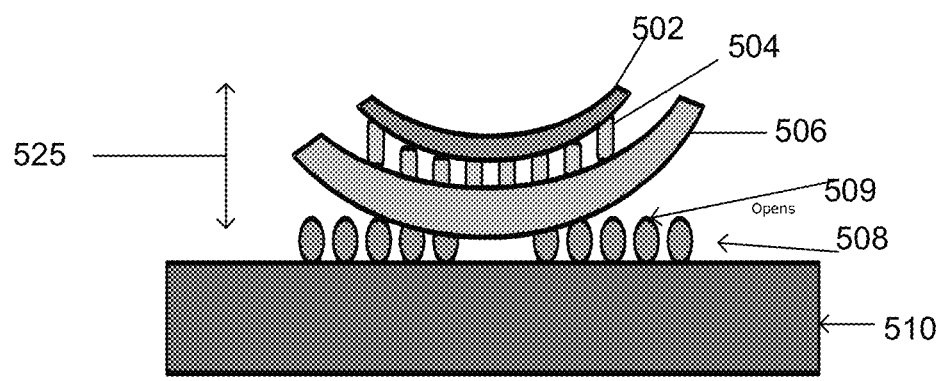

The prior art die and patch stack typically exhibits high warpage after surface mount reflow temperature, as the patch stack undergo a dynamic shape change during prior art reflow conditions. Such warpage causes opens 509 between the prior art solder 508 and interposer 510 and low process yield (FIG. 5*b*). In contrast, the embodiments herein using the solder balls comprising the low temperature tin-bismuth solder alloy produce a substantially flat profile patch on interposer package substrate after prior art surface mount reflow processing.

Figure 2A:
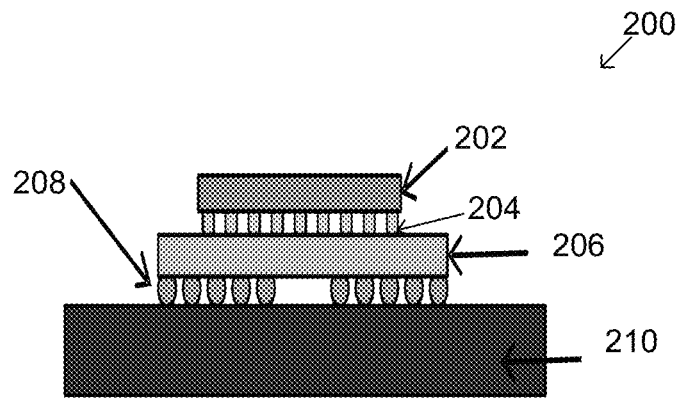
FIGS. 2a-2b represent structures according to embodiments.
Figure 2B:
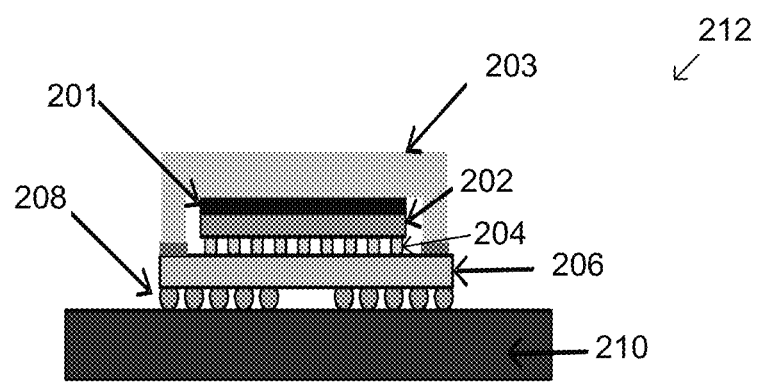

FIG. 2*a* depicts another embodiment, wherein a die 202 is coupled to a patch substrate 206 by solder balls 204. The patch substrate 206 is coupled to a substrate 210, such as a motherboard 210 by low temperature tin rich bismuth alloy solder balls 208, according to the embodiments herein. The package structure 200 may comprise a BGA package on a motherboard, in some embodiments, and comprises little to no warpage. FIG. 2*b* depicts another embodiment, wherein a die stack comprising a die 202 and solder balls 204 is disposed on a patch substrate 206. The die stack may be coupled with solder balls 208 to a substrate 210, such as an interposer or a motherboard substrate 210. The solder balls 208 comprise a low temperature tin-bismuth solder alloy according to the embodiments herein.

An integrated heat shield (IHS) 203 may be coupled to the die 202, wherein a thermal interface material (TIM) 201 is disposed between a top surface of the die 202 and a bottom surface of the IHS 203. The TIM 201 may comprise a tin-indium based solder material, and may be lead free. The package structure 212 may comprise a BGA package 212 in an embodiment, and the solder TIM 201 may comprise a melting temperature above the solder ball 208 melting temperature using the low melting temperature solder alloys herein. Since the solder TIM does not melt during surface mount reflow processing, the package 212 void creation and package reliability issues are avoided, thus providing better thermal performance.

The embodiments herein include enablement of surface mount processing of thin patch on interposer package structures, that may comprise a thickness of less than about 1.7 mm in some cases. Warpage is greatly reduced during surface mount reflow processing by reducing the solder melting temperature below about 200 degrees Celsius. The embodiments enable packages with low temperature BGA solder, very thin BGA packages, high performance computing (HPC) packages for graphic cards/PCIe cards, and solder and solder TIM between an IHS and die in BGA packages. The embodiments herein enable reduced reflow temperature, thus increasing the reliability of the package materials such as silicon, dielectric, underfill and substrate materials. The embodiments improve thermal performance and enable mobile, desktop, server, blade server, micro server as well as high performance computing technologies.

Figure 3:
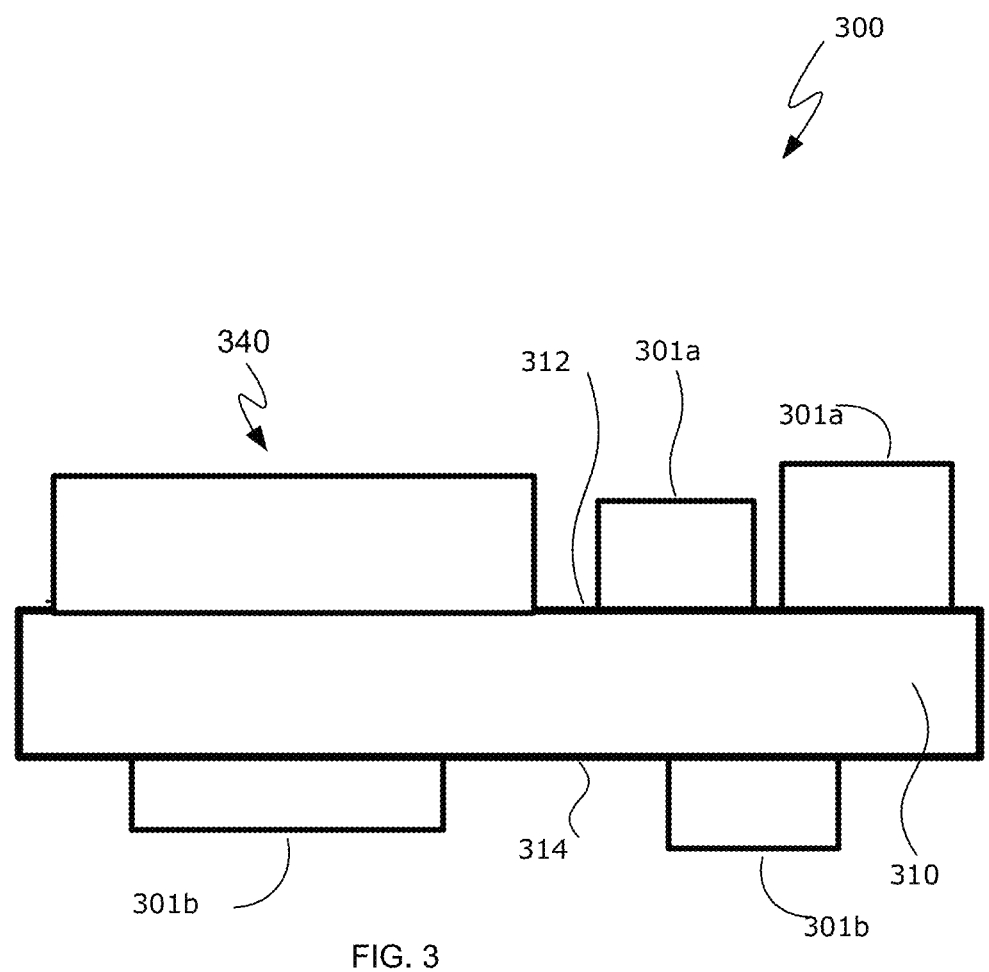
FIG. 3 represents structures according to embodiments.

Turning now to FIG. 3, illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 (which may be similar to the package structure 130 of FIG. 1*e*, for example)

disposed on the mainboard's first side 312, wherein the package structure 340 may comprise any of the microchannel structure embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301a may be disposed on the first side 312 of the mainboard 310, and components 301b may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
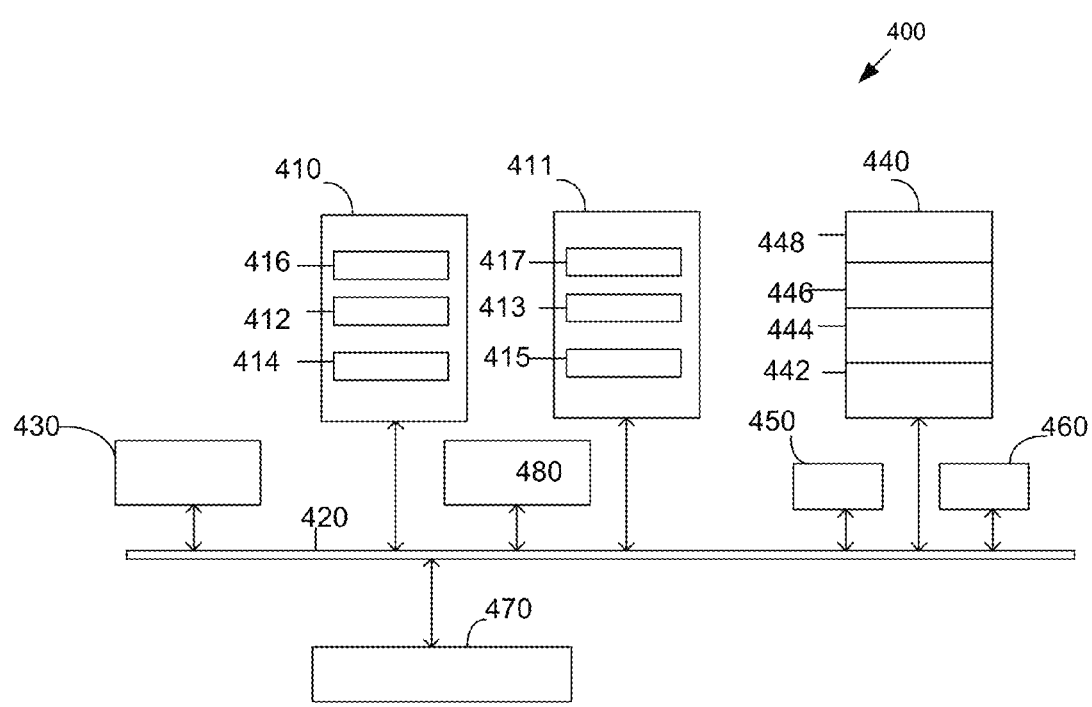
FIG. 4 represents a system according to embodiments.

FIG. 4 is a schematic of a computer system 400 according to an embodiment. The computer system 400 (also referred to as the electronic system 400) as depicted can embody/include a package structure that includes any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device of the various embodiments included herein. In an embodiment, the integrated circuit 410 includes a processor 412 that can include any type of packaging structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a structure comprising:
    attaching a device to a patch substrate, wherein the assembled device and patch substrate comprise a warpage;
    attaching the assembled device and patch substrate to a substrate to form a package structure; and
    reflowing the package structure at a temperature below about 200 degrees Celsius to form a substantially flat package structure.

2. The method of claim 1 further comprising wherein the package structure comprises a patch on interposer package substrate, and wherein the reflow temperature comprises a surface mount reflow temperature.

3. The method of claim 1 further comprising wherein the patch substrate is coupled to the interposer by solder balls, wherein the solder balls comprise a melting temperature of less than about 200 degrees Celsius.

4. The method of claim 3 further comprising wherein the solder balls comprise a tin bismuth alloy.

5. The method of claim 4 further comprising wherein the tin bismuth alloy comprises a tin composition of greater than about 50 percent by weight.

6. The method of claim 5 further comprising wherein the tin bismuth alloy comprises at least one of copper indium, antimony, nickel and silver, wherein the copper tin, antimony, nickel and silver comprise between about 0.5 to about 3 percent by weight of the tin bismuth alloy.

7. The method of claim 3 further comprising wherein the tin bismuth alloy suppresses a brittle phosphorus layer.

8. The method of claim 1 further comprising wherein the warpage comprises up to about 300 microns.

9. The method of claim 1 further comprising wherein the substantially flat package structure comprises a warpage of less than about 50 microns.

10. The method of claim 1 further comprising attaching an integrated heat spreader (IHS) on the substantially flat package structure, wherein the IHS comprises a solder comprising thermal interface material.

11. The method of claim 1 further comprising wherein the warped assembled die and patch substrate undergoes a shape inflection between about 150 to about 200 degrees Celsius.

12. The method of claim 3 further comprising wherein the substantially flat package substrate comprises a substantially flat BGA package.

13. The method of claim 3 further comprising wherein the substrate comprises one of an interposer and a motherboard.

14. The method of claim 3 further comprising wherein the solder balls comprise one of a eutectic and an off eutectic tin bismuth alloy.

15. A method for forming a package structure comprising:
    disposing a device on a patch substrate; and
    coupling a substrate to the patch substrate with solder balls, wherein the solder balls comprise a low melting temperature tin bismuth alloy including at least one of indium and antimony.

16. The method of claim 15 further comprising wherein the solder balls comprise an off-eutectic tin bismuth alloy.

17. The method of claim 16 further comprising wherein the off eutectic tin bismuth alloy comprises a tin composition of greater than about 50 percent by weight.

18. The method of claim 15 wherein the tin bismuth alloy comprises at least one of indium and antimony between about 0.5 to about 3 percent by weight of the tin bismuth alloy.

19. The method of claim 15 further comprising wherein the tin bismuth alloy comprises substantially no brittle phosphorus layer.

20. The method of claim 15 further comprising disposing an integrated heat spreader on the device, wherein a solder comprising thermal interface material is disposed between the integrated heat spreader and the device.

21. The method of claim 15 further comprising wherein coupling a substrate to the patch substrate with solder balls comprises coupling a substrate, comprising one of an interposer and a motherboard, to the patch substrate with solder balls.

22. A method for forming a package structure comprising:
    a die coupled to a patch substrate;
    an interposer coupled to the patch substrate; and
    solder balls coupling the interposer to the patch substrate, wherein the solder balls comprise a tin bismuth alloy including at least one of indium and antimony and comprising a melting temperature below about 200 degrees Celsius.

23. The method of claim 22 further comprising wherein the solder balls comprise BGA solder balls.

24. The method of claim 22 further comprising wherein the solder balls comprise a eutectic tin bismuth alloy.

25. The method of claim 22 further comprising wherein the solder balls are lead free.

26. The method of claim 22 further comprising:
    communicatively coupling a bus to the package structure; and
    communicatively coupling an eDRAM to the bus.

* * * * *